US012565244B2

(12) United States Patent
Otsuka et al.

(10) Patent No.: US 12,565,244 B2
(45) Date of Patent: Mar. 3, 2026

(54) ARTICLE TRANSPORT FACILITY

(71) Applicant: Daifuku Co., Ltd., Osaka (JP)

(72) Inventors: Hiroshi Otsuka, Hinocho (JP); Daichi Tomida, Hinocho (JP)

(73) Assignee: Daifuku Co., Ltd., Osaka (JP)

( * ) Notice: Subject to any disclaimer, the term of this patent is extended or adjusted under 35 U.S.C. 154(b) by 656 days.

(21) Appl. No.: 18/084,050

(22) Filed: Dec. 19, 2022

(65) Prior Publication Data

US 2023/0192150 A1     Jun. 22, 2023

(30) Foreign Application Priority Data

Dec. 20, 2021     (JP) ................................. 2021-206440

(51) Int. Cl.
| | |
|---|---|
| *B61B 3/02* | (2006.01) |
| *B61L 15/00* | (2006.01) |
| *B61L 23/04* | (2006.01) |
| *B61L 23/34* | (2006.01) |
| *H10P 72/30* | (2026.01) |

(52) U.S. Cl.
CPC ............ *B61B 3/02* (2013.01); *B61L 15/0062* (2024.01); *B61L 23/041* (2013.01); *B61L 23/34* (2013.01); *H10P 72/3218* (2026.01)

(58) Field of Classification Search
CPC ......... B61B 3/00; B61B 3/02; B61L 15/0062; B61L 15/0058; B61L 23/041; B61L 23/34; B61L 25/00; B61L 25/02; B61L 25/021; B65G 2203/02; B65G 2203/0266; B65G 2203/0283; B65G 2203/0291; H01L 21/677; H01L 21/67703; H01L 21/67724; H01L 21/6773; H01L 21/67733
USPC .......................................... 104/299, 89, 94
See application file for complete search history.

(56) References Cited

FOREIGN PATENT DOCUMENTS

| | | | |
|---|---|---|---|
| JP | H05134742 A | * | 6/1993 |
| JP | 2006248393 A | * | 9/2006 |

* cited by examiner

*Primary Examiner* — S. Joseph Morano
*Assistant Examiner* — Heaven R Buffington
(74) *Attorney, Agent, or Firm* — The Webb Law Firm

(57) ABSTRACT

An article transport facility includes a transport vehicle and a controller, and the transport vehicle includes: a drive unit; a speed detector configured to detect a traveling speed; and a distance detector configured to detect an inter-vehicle distance, which is a distance to another transport vehicle. The controller is configured to (i) refer to at least one target speed that is set in advance according to the inter-vehicle distance, and (ii) perform an inter-vehicle adjustment control to control the drive unit in such a manner as to cause the traveling speed to approach the at least one target speed, based on the traveling speed and the inter-vehicle distance, the at least one target speed includes an accelerating target speed and a decelerating target speed, and the accelerating target speed is lower than the decelerating target speed for each inter-vehicle distance.

8 Claims, 4 Drawing Sheets

ARTICLE TRANSPORT FACILITY

CROSS-REFERENCE TO RELATED APPLICATION

This application claims priority to Japanese Patent Application No. 2021-206440 filed Dec. 20, 2021, the disclosure of which is hereby incorporated by reference in its entirety.

BACKGROUND OF THE INVENTION

1. Field of the Invention

The present invention relates to an article transport facility including at least one transport vehicle that travels along a travel path to transport an article, and a controller.

2. Description of the Related Art

An example of the article transport facility as described above is disclosed in Patent Document 1 described below. JP 05-134742 A (Patent Document 1) discloses that a speed command corresponding to the distance to a forward transport vehicle is supplied to a rearward transport vehicle, whereby the rearward transport vehicle is automatically controlled to decelerate and stop in such a manner as to prevent the rearward transport vehicle from colliding with the forward transport vehicle.

SUMMARY OF THE INVENTION

Meanwhile, in the case of changing the traveling speed of a transport vehicle, a change in the traveling acceleration of the transport vehicle may cause a force in the traveling direction acting on the transport vehicle or an article transported by the transport vehicle, thus generating vibration therein. For example, if the inter-vehicle distance between the transport vehicle and a transport vehicle in front thereof is reduced during acceleration, and deceleration control is immediately started from the accelerating state, a relatively large vibration or impact may act on an article being transported or the transport vehicle.

Therefore, there is a demand for a technique that makes it possible to easily prevent a relatively large vibration or impact from acting on an article being transported or a transport vehicle in the case of changing the traveling speed of the transport vehicle.

In view of the foregoing, a characteristic feature of the article transport facility lies in an article transport facility including: a transport vehicle that travels along a travel path to transport an article; and a controller, wherein the transport vehicle includes: a vehicle body; a drive unit configured to cause the vehicle body to travel; a speed detector configured to detect a traveling speed of the vehicle body; and a distance detector configured to detect an inter-vehicle distance, which is a distance to another transport vehicle located forward of the transport vehicle in a traveling direction, the controller is configured to (i) refer to at least one target speed that is set in advance according to the inter-vehicle distance, and (ii) perform an inter-vehicle adjustment control to control the drive unit in such a manner as to cause the traveling speed to approach the at least one target speed corresponding to the inter-vehicle distance, based on the traveling speed detected by the speed detector and the inter-vehicle distance detected by the distance detector, the at least one target speed includes an accelerating target speed used during acceleration of the vehicle body, and a decelerating target speed used during deceleration of the vehicle body, and the accelerating target speed is lower than the decelerating target speed for each inter-vehicle distance.

According to this configuration, even if the inter-vehicle distance to another transport vehicle in front of the transport vehicle is reduced during acceleration of the transport vehicle, it is possible to prevent a target speed lower than the current traveling speed from being immediately set since the accelerating target speed is lower than the decelerating target speed. Accordingly, it is possible to ensure a period during which the transport vehicle travels at a constant traveling speed. That is, it is possible to prevent the transport vehicle from immediately transitioning from an acceleration state into a deceleration state, and to cause the transport vehicle to transition from an acceleration state into a deceleration state through a constant-speed traveling state. This makes it possible to easily prevent a significant vibration or impact from acting on an article being transported and the transport vehicle.

Further features and advantages of the article transport facility will become apparent from the following description of embodiments with reference to the drawings.

DESCRIPTION OF INVENTION

1. First Embodiment

Figure 1:
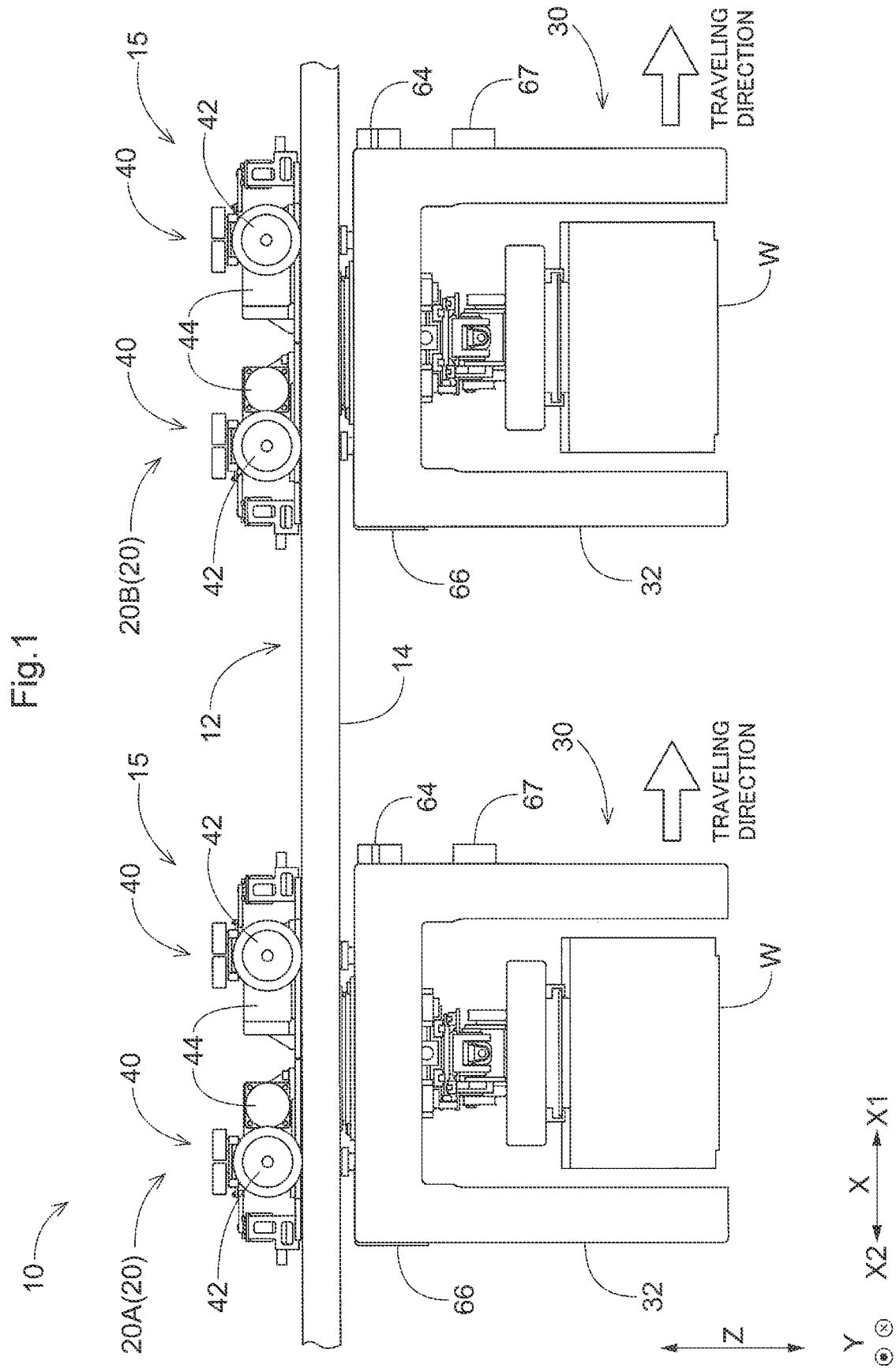
FIG. 1 is a side view of a transport vehicle according to a first embodiment.

Embodiments of an article transport facility 10 will be described with reference to the drawings. As shown in FIG. 1, the article transport facility 10 includes transport vehicles 20 that travel along a travel path 12 to transport an article W. Here, a path longitudinal direction X is the longitudinal direction (direction in which the travel path 12 extends) of the travel path 12, and a path width direction Y is the width direction of the travel path 12. The path width direction Y is orthogonal to both the path longitudinal direction X and a vertical direction Z. A forward side (downstream side) X1 is a forward side of the traveling direction of the transport vehicles 20 in the path longitudinal direction X, and a rearward side (upstream side) X2 is a rearward side of the traveling direction of the transport vehicles 20 in the path longitudinal direction X. The illustrated example shows a transport vehicle 20A as a transport vehicle 20 on the rearward side X2, and a transport vehicle 20B as a transport vehicle 20 on the forward side X1. Although the following description is focused on the configuration of the transport vehicle 20A, the transport vehicle 20A and the transport vehicle 20B have the same configuration in the present embodiment.

In the present embodiment, the article transport facility 10 includes travel rails 14 (here, a pair of travel rails 14 spaced apart in the path width direction Y) disposed along the travel path 12, and the transport vehicle 20A travels along the travel rails 14. In the illustrated example, the transport vehicle 20A is a ceiling guided vehicle that travels along the travel path 12 formed along a ceiling, and the travel rails 14 are suspended and supported from the ceiling, for example. Although the type of the article W is not limited, examples of the article W include a FOUP (Front Opening Unified Pod) that accommodates semiconductor wafers.

The transport vehicle 20A includes a main body portion 30, and travel portions 40 that cause the main body portion 30 to travel. The travel portions 40 travel along the travel rails 14. In the present embodiment, each travel portion 40 includes wheels 42 that roll on traveling surfaces of the travel rails 14, and a drive unit 44 (e.g., an electric motor such as a servo motor) that causes the wheels 42 to rotate. As a result of the wheel 42 being driven to rotate by the drive unit 44, the travel portion 40 travels along the travel rails 14. Although the details are omitted, the travel portion 40 includes guide wheels that roll on guide surfaces of the travel rails 14, and the travel portion 40 travels along the travel rails 14 while the guide wheel is in contact with and guided by the guide surfaces of the travel rails 14. In the illustrated example, the transport vehicle 20A includes a pair of travel portions 40 arranged in the path longitudinal direction X.

In the present embodiment, the main body portion 30 is coupled to the travel portions 40. In the illustrated example, the main body portion 30 is supported by the travel portions 40 while being disposed below the travel portions 40 in the vertical direction Z. The main body portion 30 includes a supporting portion 32 that supports an article W, and the article W is transported by the transport vehicle 20A while being supported by the supporting portion 32. The main body portion 30 and the travel portions 40 correspond to a vehicle body 15.

Figure 2:
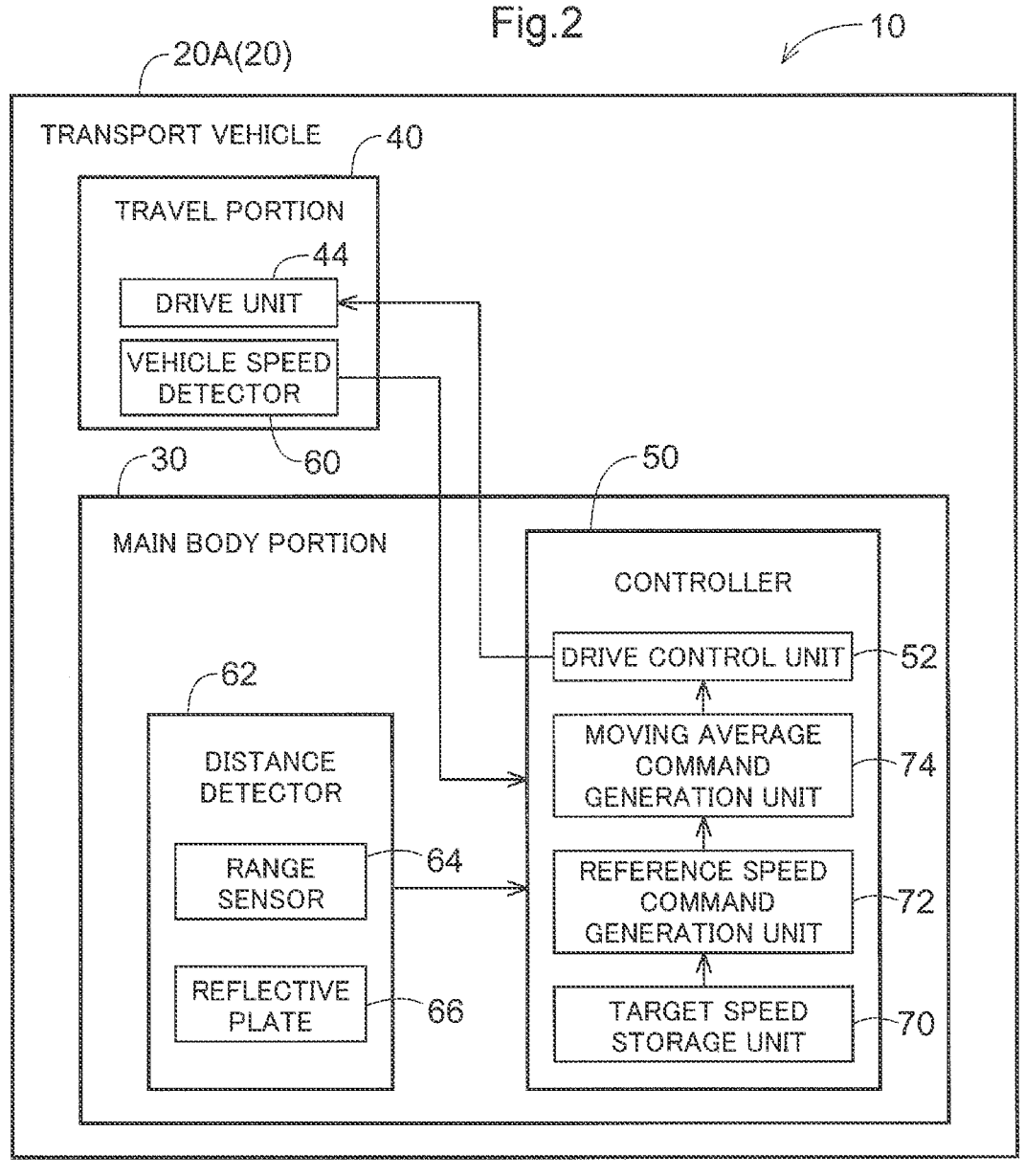
FIG. 2 is a control block diagram according to the first embodiment.

As shown in FIG. 2, the article transport facility 10 includes a controller 50. The controller 50 includes an arithmetic processing device such as a CPU, and also includes a peripheral circuit such as a memory. Various functions of the controller 50 are implemented by these pieces of hardware working cooperatively with a program executed on hardware such as the arithmetic processing device. Although the controller 50 is provided in the transport vehicle 20A in the present embodiment, the controller 50 may be provided in an external control device (not shown) independent from the transport vehicle 20A. When the controller 50 includes a plurality of pieces of hardware that are communicatively separated from each other, some of the pieces of hardware may be provided in the transport vehicle 20A, and the remaining pieces of the hardware may be provided in the above-described external control device.

As shown in FIG. 2, the transport vehicle 20A includes a vehicle speed detector 60 capable of detecting a traveling speed V of the transport vehicle 20A. The vehicle speed detector 60 is configured to detect the traveling speed V of the transport vehicle 20A, based on, for example, the number of revolutions of the wheels 42 within a predetermined time, and the relative speed with respect to the travel rails 14, and transmits, to the controller 50, the information of the traveling speed V as a detection signal. In the illustrated example, the vehicle speed detector 60 is provided in each travel portion 40.

As shown in FIG. 2, the transport vehicle 20A includes a distance detector 62 for detecting an inter-vehicle distance L to another transport vehicle 20B. The travel path 12 is configured to allow a plurality of transport vehicles 20 (20A, 20B) to travel therealong. Therefore, to prevent a contact between the transport vehicles 20 (20A, 20B), the transport vehicle 20A includes a distance detector 62 for detecting the inter-vehicle distance L to another transport vehicle 20B in front of the transport vehicle 20A. In the present embodiment, the distance detector 62 includes a reflective plate 66, and a range sensor 64 that projects light toward a reflective plate 66 provided in the forward transport vehicle 20B. The range sensor 64 is configured to receive reflected light that is reflected from the reflective plate 66 provided in the forward transport vehicle 20B, and transmits, to the controller 50, information, including, for example, the time until the reflected light is received after the light has been projected, and the distance between the light projection position and the light receiving position as a detection signal indicating the inter-vehicle distance L. In the illustrated example, the distance detector 62 is provided in the main body portion 30.

As shown in FIG. 1, in the present embodiment, the transport vehicle 20A includes an obstacle sensor 67 for detecting an obstacle that obstructs the travel in the travel path 12. The obstacle sensor 67 is configured, for example, to project light over a preset detection range, and detect an obstacle in response to receiving the light reflected by the obstacle. If an obstacle is detected, the controller 50 of the article transport facility 10 causes the transport vehicle 20A to stop. Note that the foregoing has described an example in which the range sensor 64 and the obstacle sensor 67 are each formed as an optical sensor that projects and receives light. However, the present disclosure is not limited to such a configuration, and the range sensor 64 and the obstacle sensor 67 may each be formed as an ultrasonic sensor that emits ultrasonic waves.

The controller 50 controls the traveling operation of the travel portions 40. In the present embodiment, the controller 50 includes a drive control unit 52 that controls the traveling operation of each travel portion 40 by controlling the driving of the drive unit 44. As shown in FIG. 1, the transport vehicle 20A includes two travel portions 40 arranged in the path longitudinal direction X. In this case, it is possible to adopt a configuration in which the two travel portions 40 are configured in the same manner, or a configuration in which a second travel portion 40 is configured to travel following the travel of a first travel portion 40. In the latter case, the drive control unit 52 controls the driving torque of the wheel 42 applied by the drive unit 44 of the second travel portion 40 such that the second travel portion 40 travels following the travel of the first travel portion 40, for example. The second travel portion 40 may be caused to travel following the travel of the first travel portion 40 by the drive control unit 52 performing a control (torque-free control) to control the driving torque of the wheel 42 applied by the drive unit 44 of the second travel portion 40 to zero.

The drive control unit 52 is configured to refer to a target speed Vo that is set in advance according to the inter-vehicle distance L. The drive control unit 52 performs an inter-vehicle adjustment control to control the drive unit 44 in such a manner as to cause the traveling speed V to approach the target speed Vo corresponding to the inter-vehicle distance L, based on a traveling speed V detected by the vehicle speed detector 60 and the inter-vehicle distance L detected by the distance detector 62. The target speed Vo includes an accelerating target speed Vα used during acceleration of the vehicle body 15, and a decelerating target speed Vβ used during deceleration of the vehicle body 15, and the accelerating target speed Vα is lower than the decelerating target speed Vβ for each inter-vehicle distance L. Accordingly, even if the inter-vehicle distance L to another transport vehicle 20B in front of the transport vehicle 20A is reduced during acceleration of the transport vehicle 20A, it is possible to prevent a target speed Vo lower than the current traveling speed V from being set immediately since the accelerating target speed Vα is lower than the decelerating target speed Vβ. Accordingly, it is possible to ensure a period during which the transport vehicle 20A travels at a constant traveling speed V. That is, it is possible to prevent the transport vehicle 20A from immediately transitioning from an acceleration state into a deceleration state, and to cause the transport vehicle 20A to transition from an acceleration state into a deceleration state through a constant-speed traveling state. This makes it possible to easily prevent a significant vibration or impact from acting on an article being transported W and the transport vehicle 20A.

As shown in FIG. 2, in the present embodiment, the controller 50 includes a target speed storage unit 70 in which the target speed Vo is stored. Although the target speed storage unit 70 is provided in the main body portion 30 of the transport vehicle 20A in the illustrated example, it is possible to adopt a configuration in which the target speed storage unit 70 is provided in an external control device (not shown), and the drive control unit 52 provided in the transport vehicle 20A refers to the target speed Vo via communication. It is also possible to adopt a configuration in which the target speed storage unit 70 and the drive control unit 52 are provided in the external control device, and the drive control unit 52 that has referred to the target speed Vo controls the drive unit 44 provided in the transport vehicle 20A via communication.

Figure 3:
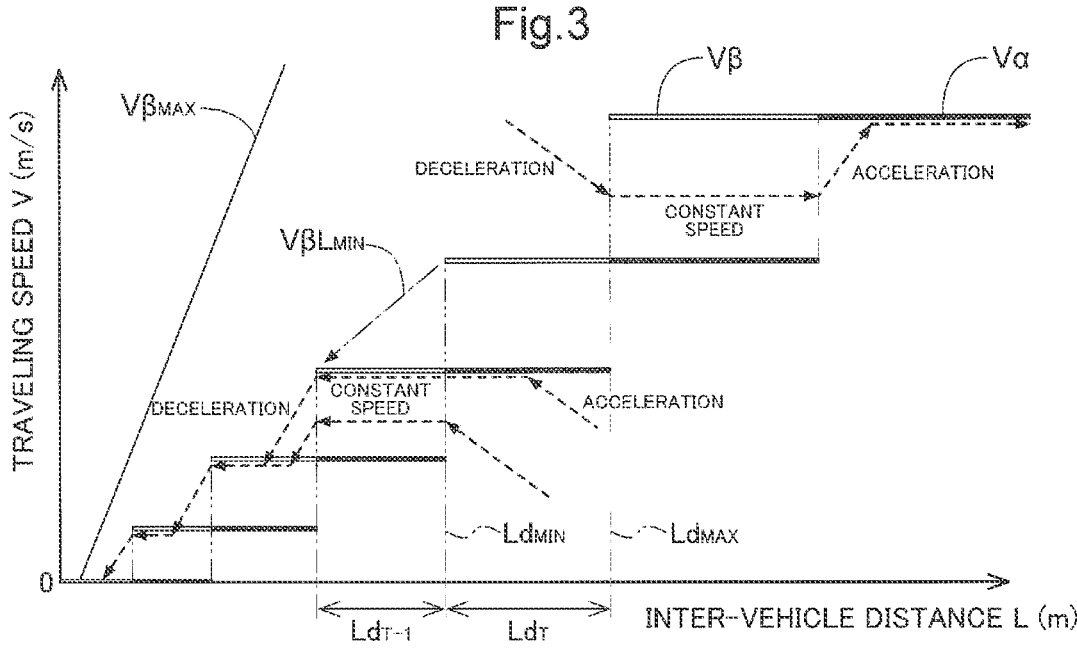
FIG. 3 is a graph showing a target speed pattern according to the first embodiment.

It is preferable that the target speed Vo stored in the target speed storage unit 70 is stored as a target speed pattern. The target speed graph of FIG. 3 is an example of the target speed pattern stored in the target speed storage unit 70. In FIG. 3, the vertical axis represents the traveling speed V (m/s) of the transport vehicle 20A, the horizontal axis represents the inter-vehicle distance L (m), the accelerating target speed Vα is indicated by the solid thick line, and the decelerating target speed Vβ is indicated by the outlined line. Examples of the actual changes in the traveling speed V and the inter-vehicle distance L during acceleration and deceleration of the transport vehicle 20A are indicated by the dashed arrows. In the present embodiment, the accelerating target speed Vα and the decelerating target speed Vβ are set stepwise in such a manner as to decrease with a decrease in the inter-vehicle distance L for a unit a plurality of distance segments Ld in which the inter-vehicle distance L is segmented. In the illustrated example, adjacent distance segments Ld border each other. Preferably, the difference between the accelerating target speed Vα and the decelerating target speed Vβ set for each distance segment Ld decreases with a decrease in the inter-vehicle distance L of the distance segment Ld.

As indicated by the dashed arrows of FIG. 3, the drive control unit 52 maintains the traveling speed V in response to the traveling speed V being a speed between the accelerating target speed Vα and the decelerating target speed Vβ that corresponds to the inter-vehicle distance L. In response to the traveling speed V being lower than the accelerating target speed Vα corresponding to the inter-vehicle distance L, the drive control unit 52 cause the vehicle body 15 to accelerate at a preset reference acceleration Aαc until the accelerating target speed Vα is reached. In response to the traveling speed V being higher than the decelerating target speed Vβ corresponding to the inter-vehicle distance L, the drive control unit 52 causes the vehicle body 15 to decelerate at a preset reference deceleration Mc until the decelerating target speed Vβ is reached. Note that an acceleration Aα during acceleration of the vehicle body 15, and a deceleration Aβ during deceleration of the vehicle body 15 are each represented by an absolute value, or in other words, a positive value. The reference acceleration Aαc and the reference deceleration Mc each take a value greater than 0.

As shown in FIG. 3, a target segment $Ld_T$ is a distance segment Ld of interest, and a shorter-distance-side adjacent segment $Ld_{T-1}$ is a distance segment Ld adjacent to the target segment $Ld_T$ on a shorter side of the inter-vehicle distance L relative to the target segment $Ld_T$. In the present embodiment, the accelerating target speed Vα set for the target segment $Ld_T$ is a speed equivalent to the decelerating target speed Vβ set for the shorter-distance-side adjacent segment $Ld_{T-1}$. Accordingly, even if the inter-vehicle distance L has decreased across a border between the distance segments Ld after transition from an acceleration state into a constant-speed traveling state, it is possible to prevent the target speed Vo from changing stepwise when crossing the border.

A constant-speed necessary distance Lc is a travel distance that needs to be traveled at a constant speed by the transport vehicle 20A. In the present embodiment, the plurality of distance segments Ld each have an upper limit $Ld_{MAX}$ and a lower limit $Ld_{MIN}$ separated by a distance (length) ΔLd ($=Ld_{MAX}-Ld_{MIN}$) greater than or equal to the constant-speed necessary distance Lc. The constant-speed necessary distance Lc is set in advance, taking into account the vibration and impact acting on an article W being transported and the transport vehicle 20A. Preferably, a different value of the constant-speed necessary distance Lc is set for each distance segment Ld to according to the inter-vehicle distance L. More preferably, the value of the constant-speed necessary distance Lc set for each distance segment Ld decreases with a decrease in the inter-vehicle distance L of the distance segment Ld.

A maximum deceleration $Aβ_{MAX}$ is a maximum value of the deceleration Aβ allowed for the transport vehicle 20A. In the present embodiment, the decelerating target speed Vβ is set such that, while another transport vehicle 20B located on the forward side X1 in the traveling direction is stopped, the deceleration Aβ is less than or equal to the maximum deceleration $Aβ_{MAX}$ while the traveling speed V of the transport vehicle 20A is reduced in such a manner as to approach the decelerating target speed Vβ, which decreases with a decrease in the inter-vehicle distance L. Note that the maximum deceleration $Aβ_{MAX}$ is a value greater than 0. Accordingly, even if another transport vehicle 20B that is stopped in front of the transport vehicle 20A is detected while the transport vehicle 20A is accelerating, a distance greater than or equal to the constant-speed necessary distance Lc can be ensured for the transport vehicle 20A to travel in a constant-speed traveling state to transition from an acceleration state into a deceleration state.

More specifically, the length ΔLd and the decelerating target speed Vβ of each of the plurality of distance segments Ld are set such that the deceleration Aβ is less than or equal to the maximum deceleration $Aβ_{MAX}$ if the distance detector 62 of the transport vehicle 20A after acceleration detects the inter-vehicle distance L to another transport vehicle 20B that is stopped. In the example shown in FIG. 3, the length ΔLd ($=Ld_{MAX}-Ld_{MIN}$) and the decelerating target speed Vβ of each of the distance segments Ld are set such that an inclination ($dVβ_{MIN}/dL$) of the shortest deceleration line $VβL_{MIN}$ is less than or equal to the maximum deceleration $Aβ_{MAX}$, the shortest deceleration line $VβL_{MIN}$ being indicated by a dash-dot line connecting the values of the decelerating target speeds Vβ of the corresponding distance segments Ld at the lower limit $Ld_{MIN}$.

The decelerating target speed Vβ corresponding to the inter-vehicle distance L is preferably less than or equal to a maximum value Vβ$_{MAX}$ obtained by the following expression, using the inter-vehicle distance L (m), a distance Lcβ (m) necessary for acceleration, a distance Lcβ (m) necessary for deceleration, and a constant-speed necessary time Tc (s).

$$V\beta_{MAX}=\{L-(Lc\alpha+Lc\beta)\}\div Tc \qquad (1)$$

FIG. 3 shows an example of the maximum value Vβ$_{MAX}$. In this manner, even if another transport vehicle 20B that is stopped in front of the transport vehicle 20A is detected while the transport vehicle 20A is accelerating, a time greater than or equal to the constant-speed necessary time Tc can be ensured for the transport vehicle 20A to travel in a constant-speed traveling state to transition from an acceleration state into a deceleration state. Although FIG. 3 shows a case where the distance Lcβ necessary for acceleration, the distance Lcβ necessary for deceleration, and the constant-speed necessary time Tc each have a constant value regardless of the inter-vehicle distance L, these values may vary according to the inter-vehicle distance L.

The target speed pattern stored in the target speed storage unit 70 may be a target speed table as shown in Table 1 below.

TABLE 1

| Inter-vehicle distance L (m) | | | Accelerating target speed Vα (m/s) | Decelerating target speed Vβ (m/s) |
|---|---|---|---|---|
| L7 | <L | | Vα6 | — |
| L6 | <L≤ | L7 | Vα5 | — |
| L5 | <L≤ | L6 | Vα4 | Vβ5 |
| L4 | <L≤ | L5 | Vα3 | Vβ4 |
| L3 | <L≤ | L4 | Vα2 | Vβ3 |
| L2 | <L≤ | L3 | Vα1 | Vβ2 |
| L1 | <L≤ | L2 | 0 | Vβ1 |
| 0 | <L≤ | L1 | 0 | 0 |

In the present embodiment, when performing the inter-vehicle adjustment control, the controller 50 generates a reference speed command Vk indicative of a time-varying map of the traveling speed V in which the acceleration Aα or the deceleration Aβ changes stepwise such that the traveling speed V reaches the target speed Vo. In addition, the controller 50 generates a moving average command Vkh obtained from a moving average of the reference speed command Vk in a preset period, and controls the drive unit 44 based on the moving average command Vkh. As shown in FIG. 2, in the present embodiment, the controller 50 includes a reference speed command generation unit 72 that generates the reference speed command Vk by referring to the target speed Vo stored in the target speed storage unit 70, and a moving average command generation unit 74 that generates the moving average command Vkh from the reference speed command Vk, and the drive control unit 52 controls the drive unit 44 in accordance with the moving average command Vkh. Note that the reference speed command generation unit 72 and the moving average command generation unit 74 are separated at least logically, but are not necessarily separated physically.

The reference speed command generation unit 72 generates, based on the traveling speed V and the inter-vehicle distance L, a reference speed command Vk indicative of a time-varying pattern of the traveling speed V in which an acceleration or a deceleration changes stepwise such that the traveling speed V reaches the target speed Vo, for example, at a target position located on the forward side X1 of the travel path 12 relative to the current position of the vehicle body 15. The reference speed command Vk is generated every set time, for example, every operation period.

The moving average command generation unit 74 generates a moving average command Vkh obtained from a moving average of the reference speed command Vk in a preset period, or in other words, a moving average time. The moving average command (speed command after moving average processing) Vkh is generated based on time-series data of the reference speed command Vk for each set time. In the present embodiment, the moving average is a simple moving average obtained without weighting. However, the present disclosure is not limited thereto, and the moving average may be a weighted moving average or the like that is obtained through weighting.

Figure 4:
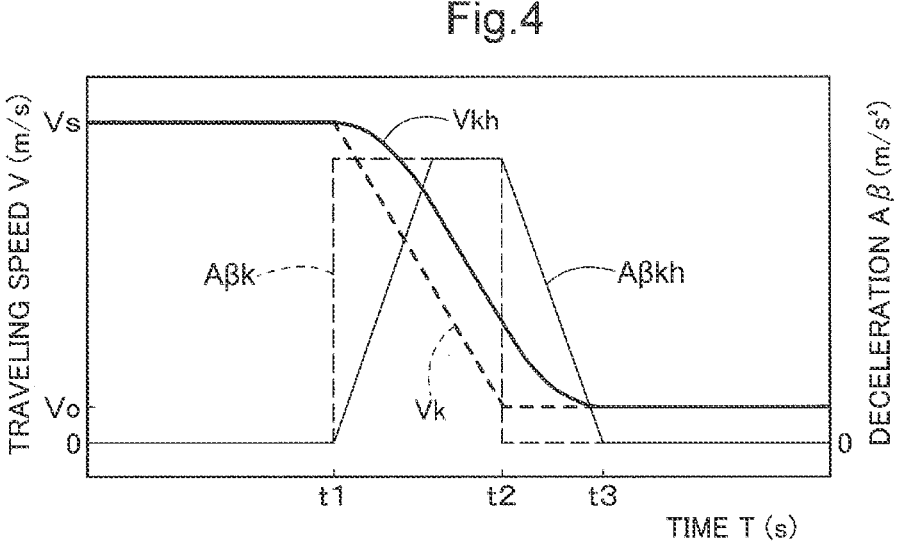
FIG. 4 is a graph showing a moving average command according to the first embodiment.

FIG. 4 is a graph used by the controller 50 when controlling the drive unit 44, showing the reference speed command Vk and the moving average command Vkh, where the vertical axis represents the traveling speed V (m/s) of the transport vehicle 20A and the horizontal axis represents the time T (s). On the graph of FIG. 4, an example of the reference speed command Vk during deceleration, which is an example of a time-varying pattern of the traveling speed V in which the acceleration Aα or the deceleration Aβ changes stepwise, is indicated by the dashed line. In the reference speed command Vk, a transport vehicle traveling at a speed change starting speed Vs, which is a constant speed, is decelerated from the speed change starting speed Vs to the target speed (speed change ending speed) Vo between time t1 and time t2, with the deceleration Aβ kept constant. As indicated by the dashed line in FIG. 4, a deceleration Mk in the reference speed command Vk changes stepwise at the time t1 and the time t2.

In the graph of FIG. 4, an example of the moving average command Vkh, which is an example of the speed command after the moving average processing, is indicated by the solid line. As indicated by the solid line in FIG. 4, a deceleration Aβkh in the moving average command Vkh changes continuously at the time t1 and the time t2. As can be clearly seen from FIG. 4, in the case where the traveling operation of the travel portions 40 is controlled in accordance with the moving average command Vkh, the traveling speed V of the transport vehicle 20A can be changed in such a manner as to smooth the change in the acceleration Aα or the deceleration Aβ as compared with a case where the traveling operation of the travel portions 40 is controlled by directly using the reference speed command Vk.

2. Second Embodiment

Figure 5:
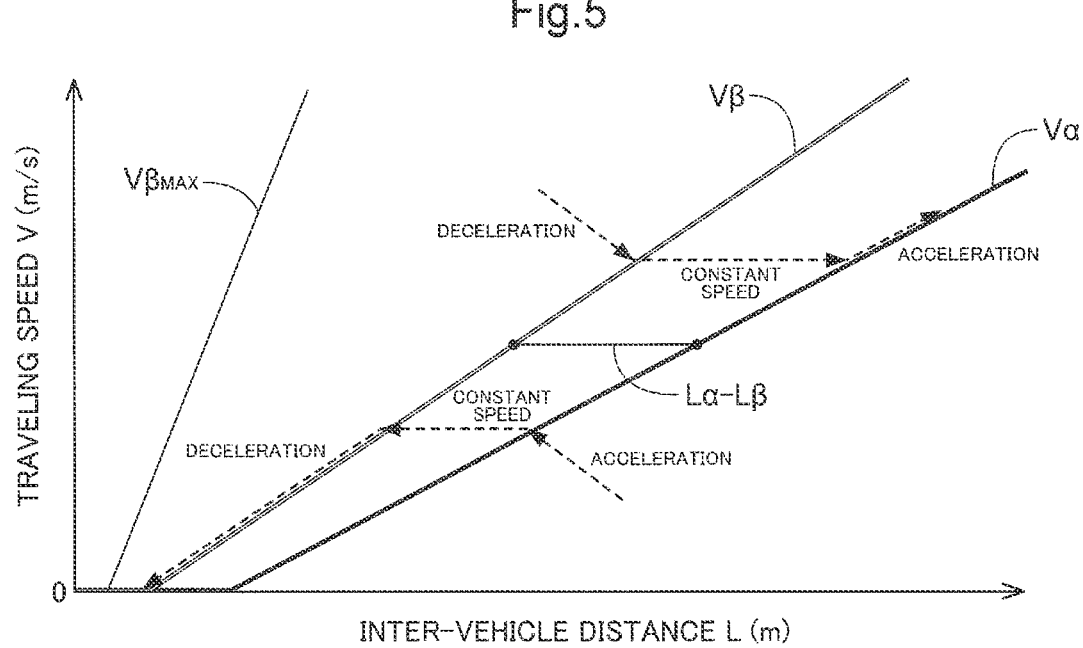
FIG. 5 is a graph showing a target speed pattern according to a second embodiment.

In the following, an article transport facility 10 according to a second embodiment will be described with reference to FIG. 5. The present embodiment is different from the above first embodiment in that the target speed graph of FIG. 5 is used as the target speed pattern in place of the target speed graph of FIG. 3. The following description is focused on the difference from the first embodiment, and the aspects that are not specifically described are the same as those of the above first embodiment.

As in the case of FIG. 3, the target speed graph of FIG. 5 is an example of the target speed pattern stored in the target speed storage unit 70. In FIG. 5, the accelerating target speed Vα is indicated by the solid thick line, and the decelerating target speed Vβ is indicated by the outlined line. Examples of the actual changes in the traveling speed V and the inter-vehicle distance L during acceleration and deceleration of the transport vehicle 20A are indicated by the dashed arrows. As shown in FIG. 5, in the present embodiment as well, the accelerating target speed Vα is lower than the decelerating target speed Vβ when the inter-vehicle distances L are the same.

As indicated by the dashed arrows in FIG. 5, in response to the traveling speed V being lower than the accelerating target speed Vα corresponding to the inter-vehicle distance L, the drive control unit 52 causes the vehicle body 15 to accelerate at a preset reference acceleration Aαc until the accelerating target speed Vα is reached. In response to the traveling speed V being a speed between the accelerating target speed Vα and the decelerating target speed Vβ corresponding to the inter-vehicle distance L, the drive control unit 52 maintains the traveling speed V. In response to the traveling speed V being higher than the decelerating target speed Vβ corresponding to the inter-vehicle distance L, the drive control unit 52 causes the vehicle body 15 to decelerate at a preset reference deceleration Aβc until the decelerating target speed Vβ is reached.

In the present embodiment, the accelerating target speed Vα and the decelerating target speed Vβ are set continuously in such a manner as to decrease with a decrease in the inter-vehicle distance L, and for each traveling speed V, the inter-vehicle distance Lα corresponding to the accelerating target speed Vα differs from the inter-vehicle distance Lβ corresponding to the decelerating target speed Vβ by a distance (Lα–Lβ shown in FIG. 5) greater than or equal to a constant-speed necessary distance Lc, which is a travel distance that needs to be traveled at a constant speed by the transport vehicle 20A.

A maximum deceleration $Aβ_{MAX}$ is a maximum value of the deceleration Aβ allowed for the transport vehicle 20A. In the present embodiment, while another transport vehicle 20B is stopped, the decelerating target speed Vβ is set such that, the deceleration Aβ is less than or equal to the maximum deceleration Aβ while the traveling speed V of the transport vehicle 20A is reduced in such a manner as to approach the decelerating target speed Vβ, which decreases continuously with a decrease in the inter-vehicle distance L. Accordingly, even if another transport vehicle 20B that is stopped in front of the transport vehicle 20A is detected while the transport vehicle 20A is accelerating, a distance greater than or equal to the constant-speed necessary distance Lc can be ensured for the transport vehicle 20A to travel in a constant-speed traveling state to transition from an acceleration state into a deceleration state. In the example shown in FIG. 5, the inclination of the decelerating target speed Vβ is set such that inclination of the decelerating target speed Vβ is less than or equal to the maximum deceleration $Aβ_{MAX}$ in response to the transport vehicle 20A after acceleration detecting an inter-vehicle distance L to another transport vehicle 20B that is stopped.

3. Other Embodiments

Next, other embodiments of the article transport facility will be described.

(1) Each of the above embodiments has described an example in which the transport vehicle 20 is formed as a ceiling guided vehicle. However, the present disclosure is not limited to such an example, and the transport vehicle 20 may be, for example, an automated guided vehicle that travels on a floor surface. In that case, the travel path 12 may be set along the travel rails 14 on the floor surface, or may be simply set on the floor surface using, for example, magnetism or the like, without using the travel rails 14.

(2) Each of the above embodiments has described, as an example, a configuration in which a linear graph of the traveling speed V versus the inter vehicle distance L is used as the accelerating target speed Vα and the decelerating target speed Vβ. However, the present disclosure is not limited to such an example. For example, a curved graph of the traveling speed V versus the inter-vehicle distance L may be used as the accelerating target speed Vα and the decelerating target speed Vβ.

(3) Each of the above embodiments has described, as an example, a configuration in which the target speed storage unit 70, the reference speed command generation unit 72, and the moving average command generation unit 74 are referred to in this order, and the drive control unit 52 controls the drive unit 44 in accordance with the moving average command Vkh. However, the present disclosure is not limited to such an example. For example, the drive unit 44 may be controlled by the drive control unit 52 directly referring to the target speed Vo stored in the target speed storage unit 70, based on the traveling speed V and the inter-vehicle distance L. Also, the drive unit 44 may be controlled in accordance with the reference speed command Vk.

(4) Note that the configurations disclosed in the embodiments described above are also applicable in combination with configurations disclosed in other embodiments as long as no inconsistency arises. With regard to the other configurations as well, the embodiments disclosed herein are in all respects as illustrative. Therefore, various modifications and alterations may be made as appropriate without departing from the gist of the present disclosure.

4. Outline of the Embodiments

In the following, the article transport facility described above will be described.

In view of the foregoing, a characteristic feature of the article transport facility lies in an article transport facility including: a transport vehicle that travels along a travel path to transport an article; and a controller, wherein the transport vehicle includes: a vehicle body; a drive unit configured to cause the vehicle body to travel; a speed detector configured to detect a traveling speed of the vehicle body; and a distance detector configured to detect an inter-vehicle distance, which is a distance to another transport vehicle located forward of the transport vehicle in a traveling direction, the controller is configured to (i) refer to at least one target speed that is set in advance according to the inter-vehicle distance, and (ii) perform an inter-vehicle adjustment control to control the drive unit in such a manner as to cause the traveling speed to approach the at least one target speed corresponding to the inter-vehicle distance, based on the traveling speed detected by the speed detector and the inter-vehicle distance detected by the distance detector, the at least one target speed includes an accelerating target speed used during acceleration of the vehicle body, and a decelerating target speed used during deceleration of the vehicle body, and the accelerating target speed is lower than the decelerating target speed for each inter-vehicle distance.

According to the present configuration, even if the inter-vehicle distance to another transport vehicle in front of the transport vehicle is reduced during acceleration of the transport vehicle, it is possible to prevent a target speed lower than the current traveling speed from being immediately set since the accelerating target speed is lower than the decelerating target speed. Accordingly, it is possible to ensure a period during which the transport vehicle travels at a constant traveling speed. That is, it is possible to prevent the transport vehicle from immediately transitioning from an acceleration state into a deceleration state, and to cause the transport vehicle to transition from an acceleration state into a deceleration state through a constant-speed traveling state. This makes it possible to easily prevent a significant vibration or impact from acting on an article being transported and the transport vehicle.

Here, as an aspect, it is preferable that the controller is configured to: in response to the traveling speed being a speed between the accelerating target speed and the decelerating target speed that correspond to the inter-vehicle distance, maintain the traveling speed; in response to the traveling speed being lower than the accelerating target speed corresponding to the inter-vehicle distance, cause the vehicle body to accelerate at a preset reference acceleration until the accelerating target speed is reached; and in response to the traveling speed being higher than the decelerating target speed corresponding to the inter-vehicle distance, cause the vehicle body to decelerate at a preset reference deceleration until the decelerating target speed is reached, the accelerating target speed and the decelerating target speed are set stepwise in such a manner as to decrease with a decrease in the inter-vehicle distance for in a unit a plurality of distance segments in which the inter-vehicle distance is segmented, and the accelerating target speed set for a target segment, which is a distance segment of interest, is a speed equivalent to the decelerating target speed set for a shorter-distance-side adjacent segment, which is a distance segment adjacent to the target segment on a shorter side of the inter-vehicle distance relative to the target segment.

According to the present configuration, even if the inter-vehicle distance to another transport vehicle in front of the transport vehicle is reduced during acceleration of the transport vehicle, it is possible to prevent the transport vehicle from immediately transitioning from an acceleration state into a deceleration state, and to cause the transport vehicle to transition from an acceleration state into a deceleration state through a constant-speed traveling state. This makes it possible to easily prevent a significant vibration or impact from acting on an article being transported and the transport vehicle. Since the target speed is set stepwise according to the inter-vehicle distance, it is possible to simplify the control of the traveling speed corresponding to the target speed. Furthermore, since the accelerating target speed is a speed equivalent to the decelerating target speed set for the shorter-distance-side adjacent segment, even if the inter-vehicle distance has decreased across a border between the distance segments after transition from an acceleration state into a constant-speed traveling state, it is possible to prevent the target speed from changing stepwise when crossing the border. Accordingly, in this respect as well, it is possible to easily prevent a significant vibration or impact from acting on an article being transported and the transport vehicle.

As an aspect, it is preferable that the plurality of distance segments each have an upper limit and a lower limit separated by a distance greater than or equal to a constant-speed necessary distance, which is a travel distance that needs to be traveled at a constant speed by the transport vehicle.

According to the present configuration, even if another transport vehicle that is stopped in front of the transport vehicle is detected while the transport vehicle is accelerating, a distance greater than or equal to the constant-speed necessary distance can be ensured for the transport vehicle to travel in a constant-speed traveling state to transition from an acceleration state into a deceleration state. This makes it possible to easily prevent a significant vibration or impact from acting on an article being transported and the transport vehicle.

As an aspect, it is preferable that the controller is configured to: in response to the traveling speed being a speed between the accelerating target speed and the decelerating target speed that correspond to the inter-vehicle distance, maintain the traveling speed; in response to the traveling speed being lower than the accelerating target speed corresponding to the inter-vehicle distance, cause the vehicle body to accelerate at a preset reference acceleration until the accelerating target speed is reached; and in response to the traveling speed being higher than the decelerating target speed corresponding to the inter-vehicle distance, cause the vehicle body to decelerate at a preset reference deceleration until the decelerating target speed is reached, the accelerating target speed and the decelerating target speed are set continuously in such a manner as to decrease with a decrease in the inter-vehicle distance, and for each traveling speed, the inter-vehicle distance corresponding to the accelerating target speed differs from the inter-vehicle distance corresponding to the decelerating target speed by a distance greater than or equal to a constant-speed necessary distance, which is a travel distance that needs to be traveled at a constant speed by the transport vehicle.

According to the present configuration, even if another transport vehicle that is stopped in front of the transport vehicle is detected while the transport vehicle is accelerating, a distance greater than or equal to the constant-speed necessary distance can be ensured for the transport vehicle to travel in a constant-speed traveling state to transition from an acceleration state into a deceleration state. This makes it possible to easily prevent a significant vibration or impact from acting on an article being transported and the transport vehicle.

As an aspect, it is preferable that, while said another transport vehicle is stopped, the decelerating target speed is set such that, the target transport vehicle has a deceleration less than or equal to a maximum deceleration, which is a maximum value of a deceleration allowed for the transport vehicle, while the traveling speed of the transport vehicle is reduced in such a manner as to approach the decelerating target speed, which decreases stepwise or continuously with a decrease in the inter-vehicle distance.

According to the present configuration, even if another transport vehicle that is stopped in front of the transport vehicle is detected while the transport vehicle is accelerating, the deceleration of the transport vehicle can be less than or equal to the maximum deceleration. This makes it possible to easily prevent a significant deceleration from acting on the article being transported and the transport vehicle.

As an aspect, it is preferable that the inter-vehicle adjustment control performed by the controller includes (i) generating a reference speed command, indicative of the traveling speed in which acceleration or deceleration changes stepwise, (ii) generating a moving average command obtained from a moving average of the reference speed command in a preset period, and (iii) controlling the drive unit based on the moving average command.

According to the present configuration, the traveling speed can be changed in such a manner as to smooth the change in the acceleration or the deceleration as compared with a case where the drive unit is controlled by directly using the reference speed command. Therefore, when the inter-vehicle adjustment control is performed, it is possible to reduce vibration that may be generated in the transport vehicle and an article transported by the transport vehicle.

The techniques according to the present disclosure are applicable to an article transport facility including at least one transport vehicle that transports an article, and a controller, for example.

What is claimed is:

1. An article transport facility comprising:

a transport vehicle that travels along a travel path to transport an article; and a controller, wherein the transport vehicle comprises:

a vehicle body;

a drive unit configured to cause the vehicle body to travel;

a speed detector configured to detect a traveling speed of the vehicle body; and a distance detector configured to detect an inter-vehicle distance, which is a distance to another transport vehicle located forward of the transport vehicle in a traveling direction, wherein:

the controller is configured to (i) refer to at least one target speed that is set in advance according to the inter-vehicle distance, and (ii) perform an inter-vehicle adjustment control to control the drive unit in such a manner as to cause the traveling speed to approach the at least one target speed corresponding to the inter-vehicle distance, based on the traveling speed detected by the speed detector and the inter-vehicle distance detected by the distance detector, the at least one target speed includes an accelerating target speed used during acceleration of the vehicle body, and a decelerating target speed used during deceleration of the vehicle body, in the inter-vehicle adjustment control, the accelerating target speed and the decelerating target speed are changed respectively corresponding to inter-vehicle distance, and the accelerating target speed is lower than the decelerating target speed for each inter-vehicle distance.

2. The article transport facility according to claim 1, wherein the controller is configured to:

in response to the traveling speed being a speed between the accelerating target speed and the decelerating target speed that correspond to the inter-vehicle distance, maintain the traveling speed;

in response to the traveling speed being lower than the accelerating target speed corresponding to the inter-vehicle distance, cause the vehicle body to accelerate at a preset reference acceleration until the accelerating target speed is reached; and in response to the traveling speed being higher than the decelerating target speed corresponding to the inter-vehicle distance, cause the vehicle body to decelerate at a preset reference deceleration until the decelerating target speed is reached, wherein:

the accelerating target speed and the decelerating target speed are set continuously in such a manner as to decrease with a decrease in the inter-vehicle distance, and for each traveling speed, the inter-vehicle distance corresponding to the accelerating target speed differs from the inter-vehicle distance corresponding to the decelerating target speed by a distance greater than or equal to a constant-speed necessary distance, which is a travel distance that needs to be traveled at a constant speed by the transport vehicle.

3. The article transport facility according to claim 1, wherein, while said another transport vehicle is stopped, the decelerating target speed is set such that, the target transport vehicle has a deceleration less than or equal to a maximum deceleration, which is a maximum value of a deceleration allowed for the transport vehicle, while the traveling speed of the transport vehicle is reduced in such a manner as to approach the decelerating target speed, which decreases stepwise or continuously with a decrease in the inter-vehicle distance.

4. The article transport facility according to claim 1, wherein the controller is configured to:

in response to the traveling speed being a speed between the accelerating target speed and the decelerating target speed that correspond to the inter-vehicle distance, maintain the traveling speed;

in response to the traveling speed being lower than the accelerating target speed corresponding to the inter-vehicle distance, cause the vehicle body to accelerate at a preset reference acceleration until the accelerating target speed is reached; and in response to the traveling speed being higher than the decelerating target speed corresponding to the inter-vehicle distance, cause the vehicle body to decelerate at a preset reference deceleration until the decelerating target speed is reached, wherein:

the accelerating target speed and the decelerating target speed are set continuously in such a manner as to decrease with a decrease in the inter-vehicle distance for each of a plurality of distance segments in which the inter-vehicle distance is segmented.

5. The article transport facility according to claim 1, wherein a difference between the accelerating target speed and the decelerating target speed is set to be smaller as the inner-vehicle distance is shorter.

6. An article transport facility comprising:

a transport vehicle that travels along a travel path to transport an article; and a controller, wherein the transport vehicle comprises:

a vehicle body;

a drive unit configured to cause the vehicle body to travel;

a speed detector configured to detect a traveling speed of the vehicle body; and a distance detector configured to detect an inter-vehicle distance, which is a distance to another transport vehicle located forward of the transport vehicle in a traveling direction, wherein:

the controller is configured to (i) refer to at least one target speed that is set in advance according to the inter-vehicle distance, and (ii) perform an inter-vehicle adjustment control to control the drive unit in such a manner as to cause the traveling speed to approach the at least one target speed corresponding to the inter-vehicle distance, based on the traveling speed detected by the speed detector and the inter-vehicle distance detected by the distance detector, the at least one target speed includes an accelerating target speed used during acceleration of the vehicle body, and a decelerating target speed used during deceleration of the vehicle body, and the accelerating target speed is lower than the decelerating target speed for each inter-vehicle distance, wherein the controller is configured to:

in response to the traveling speed being a speed between the accelerating target speed and the decelerating target speed that correspond to the inter-vehicle distance, maintain the traveling speed;

in response to the traveling speed being lower than the accelerating target speed corresponding to the inter-vehicle distance, cause the vehicle body to accelerate at a preset reference acceleration until the accelerating target speed is reached; and in response to the traveling speed being higher than the decelerating target speed corresponding to the inter-vehicle distance, cause the vehicle body to decelerate at a preset reference deceleration until the decelerating target speed is reached, wherein:

the accelerating target speed and the decelerating target speed are set stepwise in such a manner as to decrease with a decrease in the inter-vehicle distance in a unit of a plurality of distance segments in which the inter-vehicle distance is segmented, and the accelerating target speed set for a target segment, which is a distance segment of interest, is a speed equivalent to the decelerating target speed set for a shorter-distance-side adjacent segment, which is a distance segment adjacent to the target segment on a shorter side of the inter-vehicle distance relative to the target segment.

7. The article transport facility according to claim 6, wherein the plurality of distance segments each have an upper limit and a lower limit separated by a distance greater than or equal to a constant-speed necessary distance, which is a travel distance that needs to be traveled at a constant speed by the transport vehicle.

8. An article transport facility comprising:

a transport vehicle that travels along a travel path to transport an article; and a controller, wherein the transport vehicle comprises:

a vehicle body;

a drive unit configured to cause the vehicle body to travel;

a speed detector configured to detect a traveling speed of the vehicle body; and a distance detector configured to detect an inter-vehicle distance, which is a distance to another transport vehicle located forward of the transport vehicle in a traveling direction, wherein:

the controller is configured to (i) refer to at least one target speed that is set in advance according to the inter-vehicle distance, and (ii) perform an inter-vehicle adjustment control to control the drive unit in such a manner as to cause the traveling speed to approach the at least one target speed corresponding to the inter-vehicle distance, based on the traveling speed detected by the speed detector and the inter-vehicle distance detected by the distance detector, the at least one target speed includes an accelerating target speed used during acceleration of the vehicle body, and a decelerating target speed used during deceleration of the vehicle body, and the accelerating target speed is lower than the decelerating target speed for each inter-vehicle distance, wherein the inter-vehicle adjustment control performed by the controller includes: (i) generating a reference speed command, indicative of the traveling speed in which acceleration or deceleration changes stepwise, (ii) generating a moving average command obtained from a moving average of the reference speed command in a preset period, and (iii) controlling the drive unit based on the moving average command.

* * * * *